(12) United States Patent
Kumar et al.

(10) Patent No.: US 8,525,321 B2
(45) Date of Patent: Sep. 3, 2013

(54) CONDUCTIVE CHIP DISPOSED ON LEAD SEMICONDUCTOR PACKAGE

(75) Inventors: Jatinder Kumar, Punjab (IN); David Chong, Penang (MY)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/177,060

(22) Filed: Jul. 6, 2011

(65) Prior Publication Data
US 2013/0009309 A1    Jan. 10, 2013

(51) Int. Cl.
*H01L 23/24*    (2006.01)
(52) U.S. Cl.
USPC ............. 257/687; 257/E23.141; 257/E21.506
(58) Field of Classification Search
USPC ................. 257/666, 687, 741, 670, 686, 777, 257/E21.506, E23.141, E23.169; 438/123, 438/111, 112, 124, 126, 127
See application file for complete search history.

(56) References Cited

U.S. PATENT DOCUMENTS

| | | | |
|---|---|---|---|
| 5,266,515 A * | 11/1993 | Robb et al. | 438/154 |
| 5,616,954 A | 4/1997 | Tobase | |
| 6,597,059 B1 * | 7/2003 | McCann et al. | 257/673 |
| 6,692,991 B2 * | 2/2004 | Minamio et al. | 438/123 |
| 7,378,721 B2 | 5/2008 | Frazee et al. | |
| 7,485,971 B2 * | 2/2009 | Fuller et al. | 257/780 |
| 7,768,123 B2 * | 8/2010 | Liu et al. | 257/723 |
| 7,893,545 B2 * | 2/2011 | Otremba | 257/781 |
| 2008/0073781 A1 | 3/2008 | Chen et al. | |
| 2010/0248426 A1 | 9/2010 | Li et al. | |

* cited by examiner

*Primary Examiner* — N Drew Richards
*Assistant Examiner* — Christina Sylvia
(74) *Attorney, Agent, or Firm* — Brake Hughes Bellermann LLP (57) ABSTRACT

In one implementation, an apparatus includes a semiconductor die, a lead, a non-conductive epoxy, and a conductive epoxy. The semiconductor die includes an upper surface and a lower surface opposite the upper surface. The lead is electrically coupled to the upper surface of the semiconductor die. The non-conductive epoxy is disposed on a first portion of the lower surface of the semiconductor die. The conductive epoxy is disposed on a second portion of the lower surface of the semiconductor die. In some implementations, a conductive wire extends from the lead to the upper surface of the semiconductor die to electrically couple the lead to the upper surface of the semiconductor die.

21 Claims, 7 Drawing Sheets

CONDUCTIVE CHIP DISPOSED ON LEAD SEMICONDUCTOR PACKAGE

TECHNICAL FIELD

This description relates to a semiconductor die disposed adjacent to and/or operatively coupled to a semiconductor lead package.

BACKGROUND

Conductive device assemblies typically include a semiconductor die, such as a conductive chip, and a set of leads, such as a lead package. The semiconductor die and leads may be disposed within a packaging or molding and used within an electronic device. The semiconductor die and the leads may be disposed within the packaging such that current may be passed through the semiconductor die via the leads.

Known non-conductive assemblies can have some drawbacks. First, some known non-conductive assemblies can suffer from cooling issues (i.e., the non-conductive assemblies can overheat or have poor thermal performance). Additionally, some known conductive assemblies can be undesirably large. As some electronic devices, such as mobile phones and other consumer electronics, become more complex in their functions and become smaller in size, the size of known conductive assemblies can be a drawback.

Accordingly, there is a need for a conductive assembly that provides for better thermal performance. Additionally, there is a need for a conductive assembly having a reduced size.

SUMMARY

In one implementation, an apparatus includes a semiconductor die, a lead, a non-conductive epoxy, and a conductive epoxy. The semiconductor die includes an upper surface and a lower surface opposite the upper surface. The lead is electrically coupled to the upper surface of the semiconductor die. The non-conductive epoxy is disposed on a first portion of the lower surface of the semiconductor die. The conductive epoxy is disposed on a second portion of the lower surface of the semiconductor die. In some implementations, a conductive wire extends from the lead to the upper surface of the semiconductor die to electrically couple the lead to the upper surface of the semiconductor die.

In another implementation, an apparatus, includes a semiconductor die, a lead, and a non-conductive epoxy. The semiconductor die includes a vertical transistor device having an upper surface and a lower surface opposite the upper surface. The lead has an upper surface that is electrically coupled to the upper surface of the semiconductor die. The non-conductive epoxy is disposed on a portion of the lower surface of the semiconductor die.

In another implementation, a method of forming a conductive assembly includes depositing a non-conductive epoxy on a first portion of a lower surface of a semiconductor die and depositing a conductive epoxy on a second portion of the lower surface of the semiconductor die. In some implementations, the method includes electrically coupling a lead to an upper surface of the semiconductor die.

The details of one or more implementations are set forth in the accompanying drawings and the description below. Other features will be apparent from the description and drawings, and from the claims.

DETAILED DESCRIPTION

Figure 1:
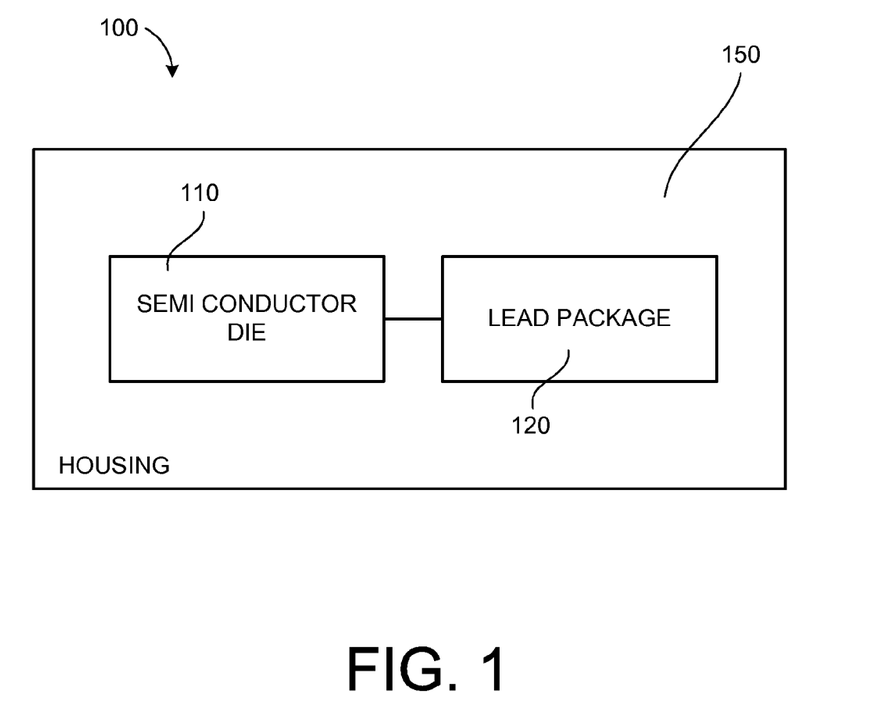
FIG. 1 is a schematic illustration of a conductive assembly according to an embodiment.

FIG. 1 is a schematic illustration of a conductive assembly 100 according to an embodiment. The conductive assembly 100 includes a semiconductor die 110 disposed within a housing 150. The conductive assembly 100 also includes a lead package 120. In some embodiments, at least a portion of the lead package 120 is also disposed within the housing 150.

The conductive assembly 100 is configured to selectively conduct current such that the conductive assembly 100 may be used in an electronic device, such as a computer type device, a power regulation device, an electronic measurement device, a cellular or mobile phone, a laptop or tablet type computer, or other type of electronic device. Specifically, the conductive assembly 100 may be configured to conduct current such that the electronic device may perform the functions specific to the particular electronic device.

In some embodiments, the semiconductor die 110 may be formed of a conductive material (e.g., silicon, germanium, gallium arsenide). For example, in some embodiments, the semiconductor die 110 is a wafer formed of silicon. In some embodiments, the semiconductor die 110 is a conductive chip or includes a semiconductor device. For example, in some embodiments, the semiconductor die is or includes a vertical transistor (e.g., a vertically-oriented transistor such as a power metal-oxide semiconductor field effect transistor (MOSFET) that may include a shield electrode).

In the illustrated embodiment, the lead package 120 is electrically or operatively coupled to the semiconductor die 110. In some embodiments, the lead package 120 includes a plurality of leads that are each individually electrically or operatively coupled to the semiconductor die 110. For example, in some embodiments, a first lead and a second lead are each electrically or operatively coupled to the semiconductor die and are electrically isolated or spaced from each other.

In some embodiments, the leads are formed of a conductive material. For example, in such embodiments, the leads may be formed of an electrically conductive metal. In some embodiments, a wire or line of electrically conductive material extends between each of the leads to electrically couple the leads to the semiconductor die 110.

The housing 150 may be formed of a non-conductive material such as a polymer or a plastic material. The housing 150 may be coupled to or formed around the semiconductor die and the lead package 120 via a molding process.

Figure 2:
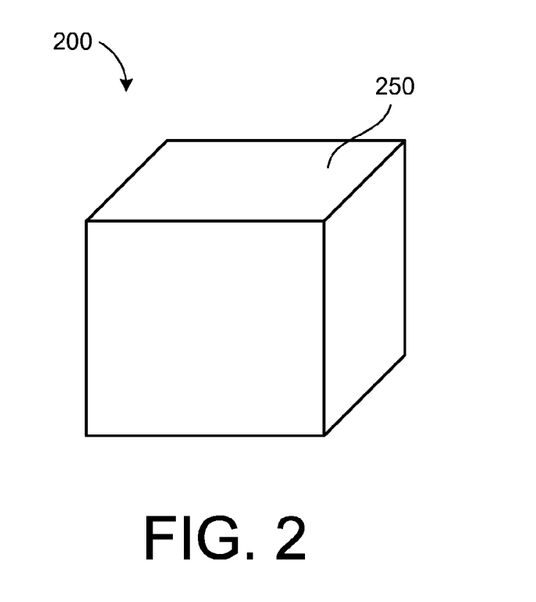
FIG. 2 is a perspective view of a conductive assembly according to an embodiment.
Figure 3:
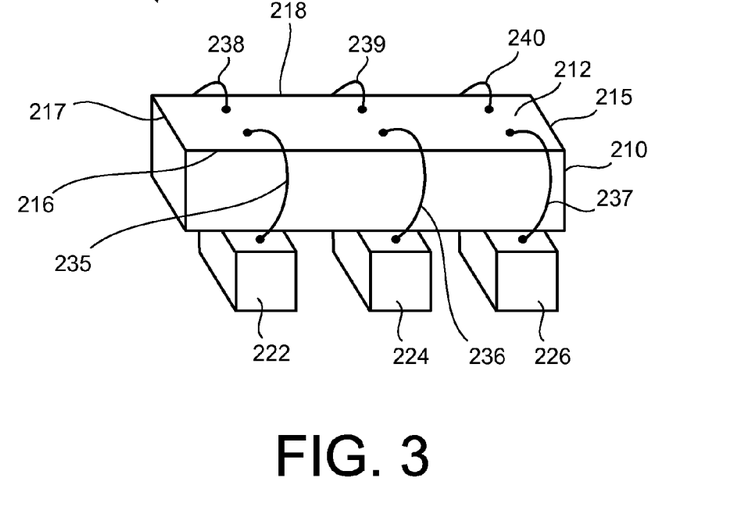
FIG. 3 is a perspective view of a portion of the conductive assembly of FIG. 2.
Figure 4:
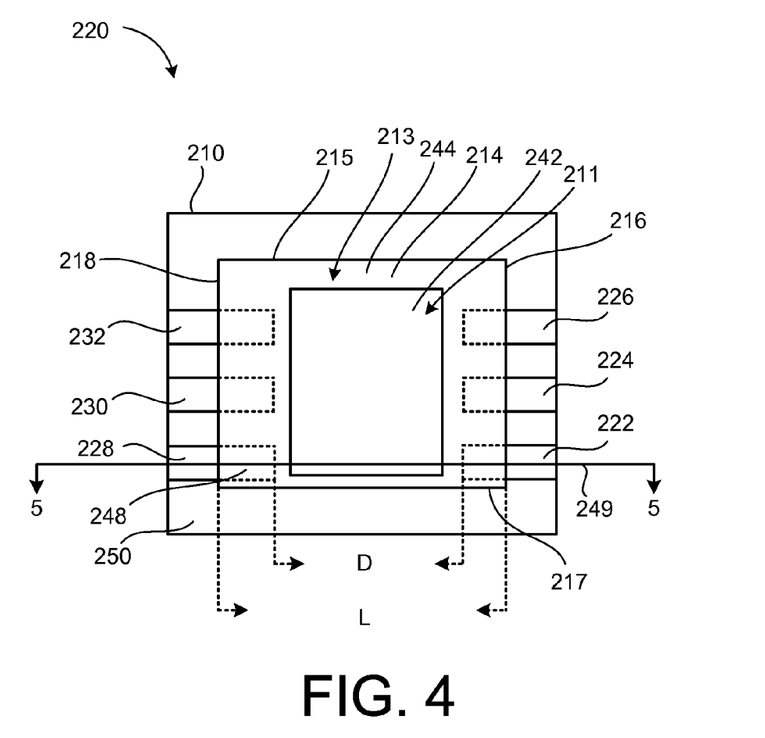
FIG. 4 is a bottom view of the conductive assembly of FIG. 2.
Figure 5:
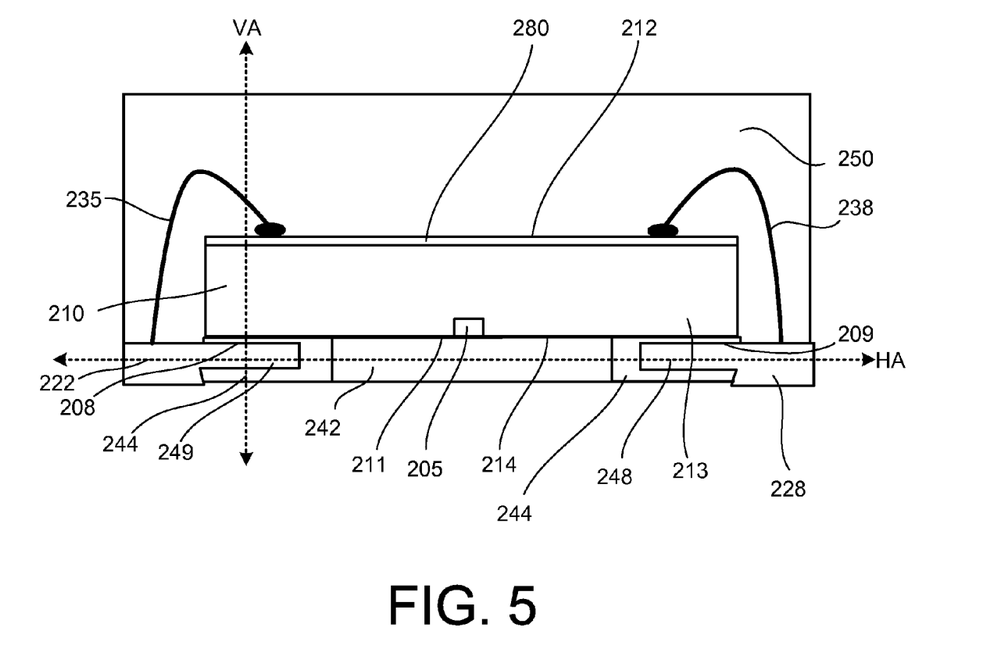
FIG. 5 is a cross-sectional view of the conductive assembly of FIG. 2 taken along line 5-5 of FIG. 4.

FIGS. 2 through 5 illustrate a conductive assembly 200 according to an embodiment. FIG. 2 is a perspective view of the conductive assembly 200. FIG. 3 is a perspective view of a portion of the conductive assembly 200. FIG. 4 is a bottom view of the conductive assembly 200. FIG. 5 is a cross-sectional view of the conductive assembly 200 taken along line 5-5 of FIG. 4.

The conductive assembly 200 includes a device or a semiconductor die 210 and a lead package 220. The components of the conductive assembly 200 are disposed within a molding (e.g., a molding compound) (also can be referred as a molding material), a packaging, or a housing 250. In some embodiments, portions of the lead package 220 (such as individual leads) extend from or are disposed outside of the housing 250.

The device or semiconductor die 210 can be any type of conductive material, such as a semi-conductor device. For example, in some embodiments, the semiconductor die includes a substrate, such as a silicon (Si) wafer, and an integrated circuit. In some embodiments, at least a portion of the integrated circuit is formed within an epitaxial layer 280 associated with (e.g., disposed upon) a surface of the substrate. In some embodiments, the semiconductor die 210 is or includes a vertical transistor.

The semiconductor die 210 includes an upper surface 212 and a lower surface 214. The upper surface 212 is disposed opposite the lower surface 214 of the semiconductor die 210. In some embodiments, the upper surface 212 of the semiconductor die 210 includes an integrated circuit.

The semiconductor die 210 also includes side portions or side edges 215, 216, 217, and 218. Side portion 215 is opposite side portion 217. Similarly, side portion 216 is opposite side portion 218.

As best illustrated in FIG. 4, the semiconductor die 210 has a length L. The length L of the semiconductor die 210 extends from one side portion to an opposite side portion. Specifically, the length L extends from or is the distance between side portion or edge 216 of the semiconductor die 210 and side portion or edge 218 of the semiconductor die 210. In some embodiments, the length L is between a few micrometers and several centimeters. In other embodiments, the length L is less than a few micrometers or greater than several centimeters.

In some embodiments, the semiconductor die 210 has a height. The height of the semiconductor die 210 extends from one side portion to an opposite side portion. Specifically, the height extends between side portion or edge 215 of the semiconductor die 210 and side portion or edge 217 of the semiconductor die 210.

In the illustrated embodiment, the semiconductor die 210, when viewed from the bottom (such as in FIG. 4), generally forms a square shape. In other embodiments, the semiconductor die 210, when viewed from the bottom, forms a rectangle or another shape. In some embodiments, the semiconductor die 210 can be formed from several separately produced and coupled semiconductor die.

The lower surface 214 of the semiconductor die 210 includes a first portion 211 and a second portion 213. The first portion 211 of the lower surface 214 is different than the second portion 213 of the lower surface 214. As best illustrated in FIG. 4, the second portion 213 of the lower surface 214 is located proximate the side portions or edges 215, 216, 217, and 218 of the semiconductor die 210. In other words, the second portion 213 extends along the perimeter of the lower surface 214 of the semiconductor die 210. The second portion 213 of the lower surface 214 surrounds the first portion 211 of the lower surface 214. In other words, the first portion 211 is located within the area surrounded by the second portion 213.

A conductive material 242 is disposed on or coupled to the first portion 211 of the lower surface 214 of the semiconductor die 210. In some embodiments, the conductive material 242 is an electrically conductive material. In some embodiments, the conductive material 242 is an adhesive, such as a conductive epoxy. In some embodiments, the conductive material 242 can be a wafer back-coated epoxy, a dispense epoxy, and so forth that includes a conductive material (e.g., metallic material) in the epoxy. In other embodiments, the conductive material 242 is another type of conductive material.

As best illustrated in FIG. 5, the conductive material 242 is directly coupled to the first portion 211 of the lower surface 214. Specifically, the conductive material 242 is in direct contact with the first portion 211 of the lower surface 214 of the semiconductor die 210. In other words, there is no intermediate layer or material between the first portion 211 of the lower surface 214 and the conductive material 242.

The first portion 211 of the lower surface 214 may include drain contact 205. Thus, the first portion 211 of the lower surface 214 may align with drain or drain contact 205 of an integrated circuit of the semiconductor die 210. As the conductive material 242 is coupled directly to the first portion 211 of the lower surface 214, current may flow or drain from the semiconductor device 210 through the first portion 211 of the lower surface 214 (and through the conductive material). As illustrated in FIG. 5, the conductive material extends from a surface of the housing 250 to the lower surface 214 of the semiconductor die 210. Thus, the first portion 211 of the lower surface 214 may be placed in electrical communication or contact from a location outside of the housing 250 (though the conductive material 242).

A non-conductive material 244 is disposed on or coupled to the second portion 213 of the lower surface 214 of the semiconductor die 210. In some embodiments, the non-conductive material 244 is an electrically non-conductive material such as a wafer back-coated epoxy, a dispense epoxy, and so forth that does not include a conductive material in the epoxy or includes an insulator in the epoxy. In some embodiments, the non-conductive material 244 is an adhesive, such as a non-conductive epoxy. In other embodiments, the conductive material 244 is another type of non-conductive material.

As best illustrated in FIG. 5, the non-conductive material 244 is directly coupled to the second portion 213 of the lower surface 214. Specifically, the non-conductive material 244 is in direct contact with the second portion 213 of the lower surface 214 of the semiconductor die 210. In other words, there is no intermediate layer or material between the second portion 213 of the lower surface 214 and the non-conductive material 244.

The lead package 220 includes several leads. In the illustrated embodiment, the lead package 220 includes leads 222, 224, 226, 228, 230, and 232. The leads 222, 224, 226, 228, 230, and 232 and are configured to facilitate the connection of the semiconductor die 210 and an integrated circuit of the semiconductor die 210 within an electronic device.

Leads 222, 224, and 226 are disposed proximate side portion 216 of the semiconductor die 210. Similarly, leads 228, 230, and 232 are disposed proximate side portion 218 of the semiconductor die 210.

In the illustrated embodiment, the lead package 220 includes six leads (222, 224, 226, 228, 230, and 232). In other embodiments, the lead package 210 can include any number of leads. For example, in some embodiments, the lead package includes more than six leads. In yet other embodiments, the lead package includes less than six leads. Additionally, in the illustrated embodiment, the leads 222, 224, 226, 228, 230, and 232 of the lead package 220 are disposed adjacent or proximate side portions 216 and 218 of the semiconductor die 210, in other embodiments, leads of the lead package are disposed adjacent all side portions of the semiconductor die 210.

In some embodiments, the leads 222, 224, 226, 228, 230, and 232 are formed of a conductive material. For example, in some embodiments, the leads 222, 224, 226, 228, 230, and 232 are formed of a metal material that is electrically conductive.

Each of the leads 222, 224, 226, 228, 230, and 232 is electrically or operatively coupled to the semiconductor die 210. Specifically, in some embodiments, the leads 222, 224, 226, 228, 230, and 232 are electrically coupled to an integrated circuit of the semiconductor die 210. In the illustrated embodiment, the leads 222, 224, 226, 228, 230, and 232 are operatively coupled to the upper surface 212 of the semiconductor die 210. In the illustrated embodiment, a wire formed of a conductive material extends from each of the leads 222, 224, 226, 228, 230, and 232 to the upper surface 212 of the semiconductor die 210. Specifically, in the illustrated embodiment, wire 235 couples the lead 222 to the upper surface 212, wire 236 couples the lead 224 to the upper surface 212, wire 237 couples the lead 226 to the upper surface 212, wire 238 couples the lead 228 to the upper surface 212, wire 239 couples the lead 230 to the upper surface 212, and wire 240 couples the lead 232 to the upper surface 212.

In other embodiments, other methods or materials are used to electrically or operatively couple the leads 222, 224, 226, 228, 230, and 232 to the upper surface 212 of the semiconductor die 210. For example, in some embodiments, more than one wire (not shown) may be used to couple one or more of the leads 222, 224, 226, 228, 230, and 232 to the semiconductor die 210. In some embodiments, a conductive clip (not shown) may be used to couple one or more of the leads 222, 224, 226, 228, 230, and 232 to the semiconductor die 210.

A portion of each of the leads 222, 224, 226, 228, 230, and 232 is disposed within the non-conductive material 244. Specifically, the leads 222, 224, 226, 228, 203, and 232 are disposed within the non-conductive material 244 such that the leads are electrically isolated from the lower surface 214 of the semiconductor die 210. Additionally, the leads are disposed within the non-conductive material 244 such that a portion of each of the leads is disposed outside of the non-conductive material 244. In other words, in the illustrated embodiment, the leads, in there entireties are not disposed within the non-conductive material 244.

As illustrated in FIG. 5, a portion of each of the lead 222 and the lead 228 are disposed within the non-conductive material 244. The lead 222 and the lead 228 are disposed within the non-conductive material such that a portion non-conductive material 244 is disposed between a surface of the lead and the lower surface 214 of the semiconductor die 210. In other words, the leads 222 and 228 are also disposed within the non-conductive material such that a portion of the non-conductive material is disposed between a surface 208 and 209 of the leads 222 and 228 and the lower layer 214 of the semiconductor die 210 and the leads 222 and 228 are electrically isolated from the lower surface 214 of the semiconductor die 210. Additionally, a portion of the each of the leads 222 and 228 are disposed outside of the non-conductive material 244.

As best illustrated in FIGS. 4 and 5, a portion of each of the leads is disposed underneath the semiconductor die 210. For example, a portion 248 of the lead 228 and a portion 249 of the lead 222 are disposed underneath or below the semiconductor die 210. The portion 248 of the lead 228 is disposed a distance D from the portion 249 of the lead 222. As the portions are disposed below or under the lower surface of the semiconductor die 210, the distance D is less than the length L of the semiconductor die 210.

In the illustrated embodiment (as best illustrated in FIG. 5), the upper surface 212 of the semiconductor die 210 includes the epitaxial layer 280. A vertical axis VA which is disposed perpendicular to the epitaxial layer 280 and the upper surface 212 of the semiconductor die 210 extends through a portion of the epitaxial layer 280, a portion of the semiconductor die 210, a portion of the non-conductive material 244, and the lead 222. Additionally, as best illustrated in FIG. 5, a horizontal axis HA, which extends parallel to the upper surface 212 or epitaxial layer 280, extends though a portion of the non-conductive material 244 and through a portion of the conductive material 242.

Figure 6A:
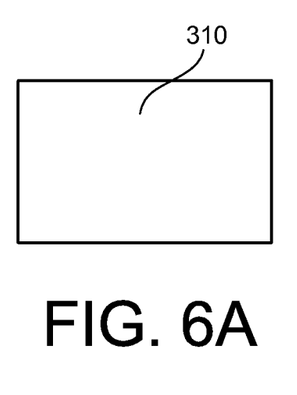
FIGS. 6A-6H schematically illustrate a process for forming a conductive assembly according to an embodiment.
Figure 6B:
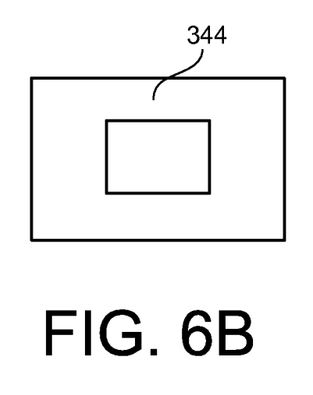
Figure 6C:
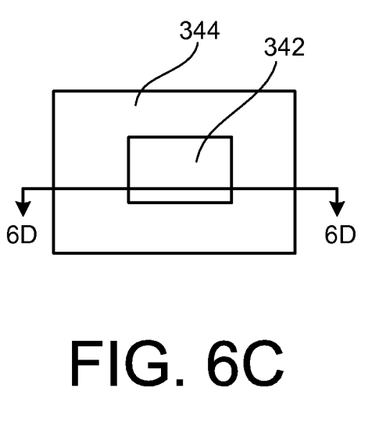

FIGS. 6A-6H illustrate a process for forming a conductive assembly 300 according to an embodiment. As illustrated in FIGS. 6A-6C, a semiconductor die 310, such as a silicon wafer, undergoes two wafer back coating ("WBC") processes. A WBC process is used to deposit or couple a non-conductive material 344, such as a non-conductive epoxy, on a backside or lower surface of the semiconductor die 310. The non-conductive material 344 is deposited on a first portion or area of the lower surface of the semiconductor die 310. In some embodiments, a stencil is used to facilitate the WBC process. In such embodiments, the non-conductive material 344 is disposed on or coupled to the portion of the lower surface of the semiconductor die 310 that is not covered or shielded by the stencil.

Another WBC process is used to deposit or couple a conductive material 342, such as a conductive epoxy, on the backside or lower surface of the semiconductor die 310. The conductive material 342 is deposited on a second portion or area of the lower surface of the semiconductor die 310. The second portion or area of the lower surface of the semiconductor die 310 is different than the first portion or area of the lower surface of the semiconductor die 310. In some embodiments, a stencil may be used during the second WBC process. For example, the stencil may be configured to cover or shield the first portion of the semiconductor die 310 (the portion that received the non-conductive material).

Figure 6D:
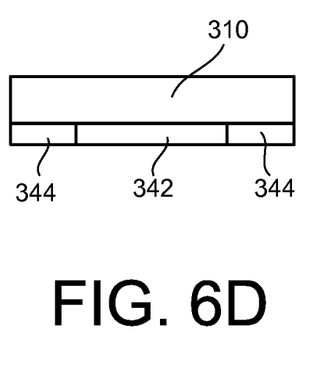

FIGS. 6D-FH are cross-sectional views of the device taken along line 6D of FIG. 6C at various times during the process. FIG. 6D illustrates the device after the two WBC processes.

Figure 6E:
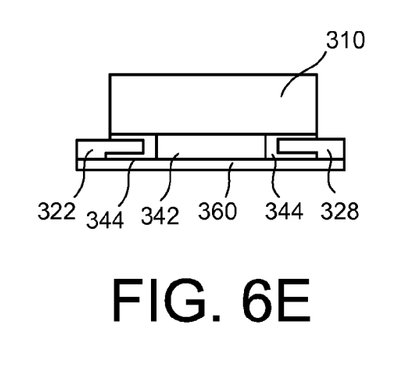

As illustrated in FIG. 6E, a lead package or lead frame 320 is then coupled to the device. Specifically, the individual leads (leads 322 and 328 are illustrated in FIG. 6E) are at least partially disposed within the non-conductive material 344. Specifically, the leads are disposed within the non-conductive material 344 such that a portion of the non-conductive material 344 is disposed between the leads and the lower surface of the semiconductor die 310 to electrically isolate the leads from the lower surface of the semiconductor die 310.

In some embodiments, the non-conductive material 344 is heated or otherwise melted or softened. The leads of the lead package may then be inserted into the softened non-conductive material. In some embodiments, the leads of the lead package may then be inserted into the softened non-conductive material after a die attach process has been performed.

In some embodiments, the leads are coupled to or within the non-conductive material 344 before the non-conductive material 344 dries or hardens. In some embodiments, heat is applied to the non-conductive material 344 to facilitate the drying or hardening of the non-conductive material 344.

Also as illustrated in FIG. 6E, a layer of tape 360 is also applied to the lower surface of the device. Specifically, the tape is placed to cover the lower surfaces of the leads, the non-conductive material 344, and the conductive material 342.

Figure 6F:
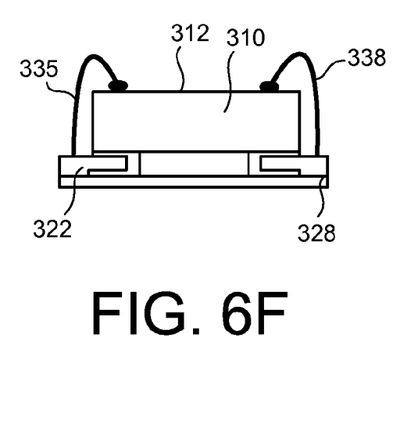

The leads of the lead package may then be electrically coupled to the upper surface 312 of the semiconductor die 310. In the illustrated embodiment, electrically conductive wires are coupled to leads and to an upper surface of the semiconductor die 310 to operatively couple the leads 322 and 328 to the semiconductor die 310.

Figure 6G:
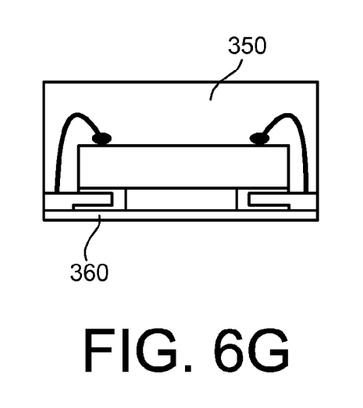
Figure 6H:
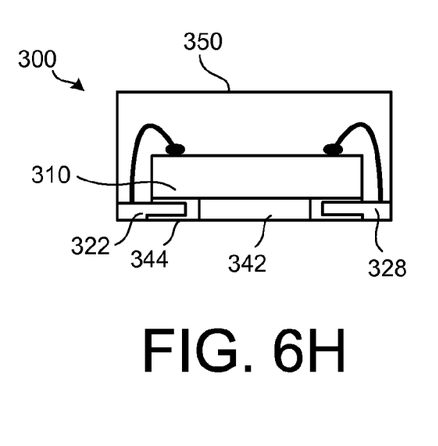

The components of the device are then placed in a molding (e.g., molding compound) or packaging 350 (as best illustrated in FIG. 6G). As illustrated in FIG. 6H, after the molding process to place the components within a housing, the tape 360 may be removed. According, the lower surface of the conductive material, the lower surface of the non-conductive material, and the lower surface of the leads 222 and 228 are exposed. In other words, the lower surface of the conductive material, the lower surface of the non-conductive material, and the lower surface of the leads 222 and 228 are disposed on the outer surface of the assembly and are exposed or disposed outside of the housing 250.

Figure 7A:
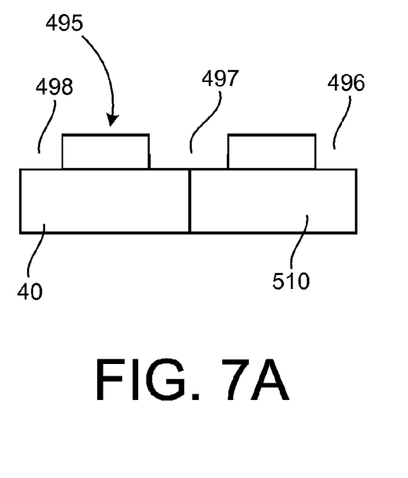
FIGS. 7A-7C schematically illustrate a process for forming a conductive assembly according to an embodiment.
Figure 7B:
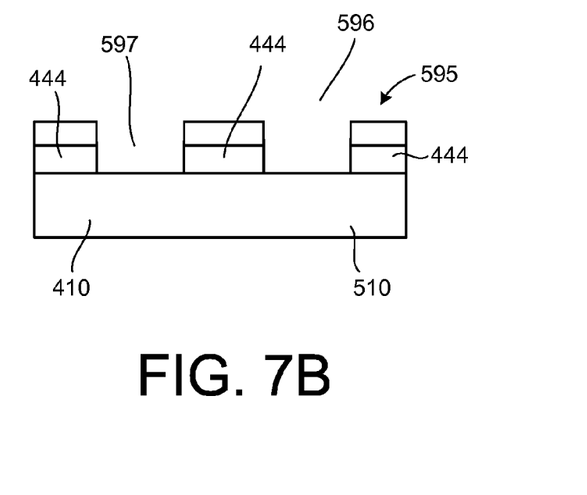
Figure 7C:
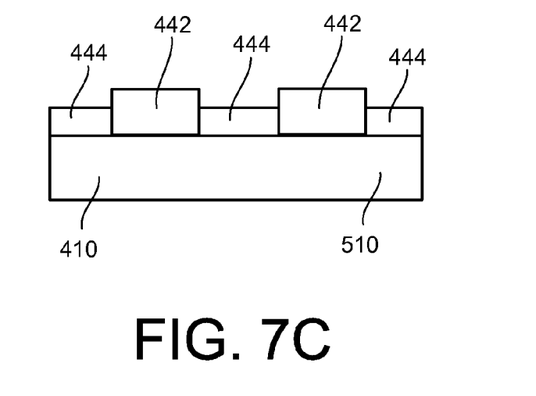

FIGS. 7A-7C are cross-sectional views during a process for forming a conductive assembly according to another embodiment. In this embodiment, more than one conductive assembly may be processed or formed at the same time. Specifically, more than one semiconductor die may be processed together. In the illustrated embodiment, two semiconductor dies are illustrated as being processed at the same time, however, any number of semiconductor dies (using various shapes and types of stencils) may be processed at the same time.

As illustrated in FIG. 7A, semiconductor die 410 is disposed adjacent to semiconductor die 510. During the first WBC process, a stencil 495 is disposed over or on top of the semiconductor dies 410 and 510. The stencil 495 includes or defines several openings 496, 497, and 498 and spans or extends over both semiconductor dies 410 and 510. The openings 496, 497, and 498 allow the non-conductive material 444 to be applied or disposed on the appropriate portions of the semiconductor dies 410 and 510 during the WBC process. In other words, the stencil 495 is configured to block or shield the portion of the semiconductor dies 410 and 510 that are configured to receive or be coated with the conductive material 442.

As illustrated in FIG. 7B, after the non-conductive material 444 is applied to the semiconductor dies 410 and 510, a second stencil 595 may be disposed over or on top of the semiconductor dies 410 and 510 and the non-conductive material 444. The stencil 595 includes or defines several openings 596 and 597 and spans or extends over both semiconductor dies 410 and 510. The openings 596 and 597 allow the conductive material 442 to be applied or disposed on the appropriate portions of the semiconductor dies 410 and 510 during the WBC process. In other words, the stencil 595 is configured to block or shield the portion of the semiconductor dies 410 and 510 that are coated with the non-conductive material 444.

As illustrated in FIG. 7C, after the two WBC processes, the semiconductor dies 410 and 510 are each coated with or coupled to a non-conductive material 444 at first locations on the upper surfaces of the semiconductor dies 410 and 510 and a conductive material 442 at second locations on the upper surfaces of the semiconductor dies 410 and 510.

In the illustrated embodiments, the non-conductive material and the conductive material are disposed on the semiconductor die such that they form squares or rectangles (and the stencils used define square or rectangular openings). In other embodiments, however, the non-conductive material and the conductive material can form other shapes (and the stencils can define openings of other shapes).

Figure 8:
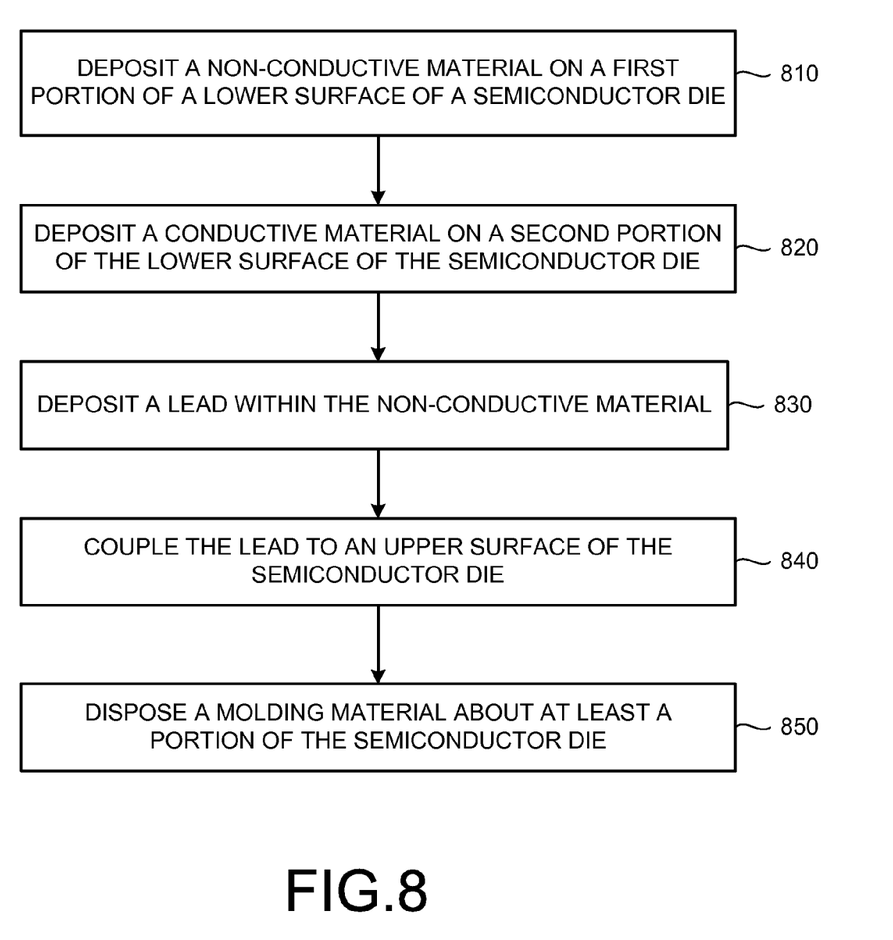
FIG. 8 is a flow chart illustrating a process of forming a conductive assembly.

In some embodiments, the layer of non-conductive material is between about 1 micron to several millimeters thick and the layer of conductive material is between about 1 micron to several millimeters thick. In some embodiments, the thickness of the non-conductive material is greater than the thickness of the conductive material. In some embodiments, the thickness of the non-conductive material is less than or equal to the thickness of the conductive material FIG. 8 is a flow chart of a process 800 for forming a conductive assembly according to an embodiment. At 810, a non-conductive material is disposed or deposited on a first portion of a lower surface of a semiconductor die. The non-conductive material may be any type of non-conductive material. In some embodiments, it is an adhesive, such as a non-conductive epoxy. In some embodiments, a WBC process is used to apply the non-conductive material to the semiconductor die. For example, in some embodiments, the non-conductive material is applied to the lower surface of the semiconductor die is in a slightly melted or flowable state and is allowed to cool or dry.

In some embodiments, the non-conductive material is deposited directly onto the surface of the semiconductor die. In other words, there is no intermediate layer or structure between the non-conductive material and the lower surface of the semiconductor die. In some embodiments, a stencil is used during the process to apply the non-conductive material to the semiconductor die.

At 820, a conductive material is disposed or deposited on a second portion of a lower surface of a semiconductor die. The conductive material may be any type of conductive material. In some embodiments, it is an adhesive, such as a conductive epoxy. In some embodiments, a WBC process is used to apply the conductive material to the semiconductor die. For example, in some embodiments, the conductive material is applied to the lower surface of the semiconductor die is in a slightly melted, wet, or flowable state and is allowed to cool or dry.

In some embodiments, the conductive material is deposited directly onto the surface of the semiconductor die. In other words, there is no intermediate layer or structure between the conductive material and the lower surface of the semiconductor die. In some embodiments, a stencil is used during the process to apply the conductive material to the semiconductor die.

At 830, a lead is deposited within the non-conductive material. In some embodiments, the non-conductive material is heated or warmed to melt or soften the non-conductive material to allow the lead to be inserted into the non-conductive material. In some embodiments, the lead is formed of an electrically conductive material. In some embodiments, the lead is disposed within the non-conductive material such that only a portion of the lead is disposed within the non-conductive material. In some embodiments, the lead is disposed within the non-conductive material such that a layer or a portion of the non-conductive material is disposed between the semiconductor die and the lead to electrically isolate the lead from the lower surface of the semiconductor die.

At 840, the lead is coupled to the upper surface of the semiconductor die. In some embodiments, the semiconductor die includes an integrated circuit and the lead is electrically coupled to the integrated circuit. In some embodiments, an electrically conductive wire is coupled to the lead and to the upper surface of the semiconductor die to electrically couple the lead to the upper surface of the semiconductor die. In some embodiments, more than one lead is disposed within the non-conductive layer or material.

At 850, a molding material is disposed about or around at least a portion of the semiconductor die. For example, in some embodiments, the semiconductor die is placed into a molding material and a material, such as a plastic or a polymer material, is molded around or about at least a portion of the device, including the semiconductor die.

In some embodiments, the molding material is disposed about or around at least a portion of the conductive device or semiconductor die such that at least a portion of the conductive material is disposed outside of the housing or molding material. In some embodiments, at least a portion of the conductive material, at least a portion of the non-conductive material, and at least a portion of the lead are disposed outside of the housing or molding material.

Although the above-described processes illustrate the non-conductive material being applied to the semiconductor dies before the conductive material is applied to the semiconductor dies, in other embodiments, the conductive material is applied to the semiconductor dies before the non-conductive material is applied to the semiconductor dies.

Also, while the various embodiments described above can be implemented in silicon, these embodiments can also be implemented in silicon carbide, gallium arsenide, gallium nitride, diamond, and/or so forth. Some examples of substrates that can be used include, but are not limited to, silicon wafers, epitaxial Si layers, bonded wafers such as used in silicon-on-insulator (SOI) technologies, and/or amorphous silicon layers, all of which may be doped or undoped. Further, the cross-sectional views of the different embodiments may not be to scale, and as such are not intended to limit the possible variations in the layout design of the corresponding structures While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
    a semiconductor die having an upper surface and a lower surface opposite the upper surface;
    a lead electrically coupled to the upper surface of the semiconductor die;
    a non-conductive epoxy disposed on a first portion of the lower surface of the semiconductor die;
    a conductive epoxy disposed on a second portion of the lower surface of the semiconductor die; and
    a housing containing at least a portion of the semiconductor die, the conductive epoxy extending from the lower surface of the semiconductor die to a location outside of the housing.

2. The apparatus of claim 1, wherein a wire of conductive material extends from the lead to the upper surface of the semiconductor die to electrically couple the lead to the upper surface of the semiconductor die.

3. The apparatus of claim 1, wherein the semiconductor die is a vertical transistor.

4. The apparatus of claim 1, wherein the semiconductor die includes an epitaxial layer, a vertical axis disposed perpendicular to the epitaxial layer extends though a portion of the epitaxial layer, a portion of the semiconductor die, a portion of the non-conductive epoxy, and a portion of the lead.

5. The apparatus of claim 1, wherein the lead includes an upper surface, a portion of the non-conductive epoxy being disposed between the upper surface of the lead and the lower surface of the semiconductor die.

6. The apparatus of claim 1, the lead being a first lead and being electrically coupled to the semiconductor die adjacent a first side of the semiconductor die, further comprising:
    a second lead electrically coupled to the upper surface of the semiconductor die adjacent a second side of the semiconductor die, the second side of the semiconductor die being opposite the first side of the semiconductor die,
    a distance between the first side of the semiconductor die and the second side of the semiconductor die being greater than a distance between the first lead and the second lead.

7. The apparatus of claim 1, wherein a horizontal axis extends substantially parallel to the lower surface of the semiconductor die, the horizontal axis extends through a portion of the non-conductive epoxy and through a portion of the conductive epoxy.

8. The apparatus of claim 1, wherein the semiconductor die includes a drain contact disposed proximate the lower surface of the semiconductor die.

9. An apparatus, comprising:
    a semiconductor die including a vertical transistor device having an upper surface and a lower surface opposite the upper surface;
    a lead having an upper surface being electrically coupled to the upper surface of the semiconductor die;
    a non-conductive epoxy disposed on a first portion of the lower surface of the semiconductor die; and
    a conductive epoxy disposed on a second portion of the lower surface of the semiconductor die, the conductive epoxy having a bottom surface exposed through the non-conductive epoxy.

10. The apparatus of claim 9, wherein at least a portion of the non-conductive epoxy is disposed between the lower surface of the semiconductor device and the upper surface of the lead.

11. The apparatus of claim 9, wherein a wire of conductive material extends from the upper surface of the lead to the upper surface of the semiconductor die to electrically couple the upper surface of the lead to the upper surface of the semiconductor die.

12. The apparatus of claim 9, further comprising:
    an epitaxial layer, a vertical axis disposed perpendicular to the epitaxial layer extends though a portion of the epitaxial layer, a portion of the semiconductor die, a portion of the non-conductive epoxy, and a portion of the lead.

13. The apparatus of claim 9, the lead being a first lead and being electrically coupled to the semiconductor die adjacent a first side of the semiconductor die, further comprising:
    a second lead electrically coupled to the upper surface of the semiconductor die adjacent a second side of the semiconductor die, the second side of the semiconductor die being opposite the first side of the semiconductor die,
    a distance between the first side of the semiconductor die and the second side of the semiconductor die being greater than a distance between the first lead and the second lead.

14. The apparatus of claim 9, further comprising:
a housing containing at least a portion of the semiconductor die, the housing including a molding.

15. An apparatus, comprising:
a semiconductor die having an upper surface and a lower surface opposite the upper surface, the lower surface having a first area surrounded by a second area of the lower surface;
a lead electrically coupled to the upper surface of the semiconductor die;
a non-conductive material disposed on the first area of the lower surface; and
a conductive material disposed on the second area, the conductive material has a bottom surface exposed outside of the non-conductive material.

16. The apparatus of claim 15, wherein a wire of conductive material extends from the lead to the upper surface of the semiconductor die to electrically couple the lead to the upper surface of the semiconductor die.

17. The apparatus of claim 15, wherein the semiconductor die includes an epitaxial layer, a vertical axis disposed perpendicular to the epitaxial layer extends though a portion of the epitaxial layer, a portion of the semiconductor die, a portion of the non-conductive material, and a portion of the lead.

18. The apparatus of claim 15, wherein the lead includes an upper surface, a portion of the non-conductive material being disposed between the upper surface of the lead and the lower surface of the semiconductor die.

19. The apparatus of claim 15, the lead being a first lead and being electrically coupled to the semiconductor die adjacent a first side of the semiconductor die, further comprising:
a second lead electrically coupled to the upper surface of the semiconductor die adjacent a second side of the semiconductor die, the second side of the semiconductor die being opposite the first side of the semiconductor die,
a distance between the first side of the semiconductor die and the second side of the semiconductor die being greater than a distance between the first lead and the second lead.

20. The apparatus of claim 15, wherein a horizontal axis extends substantially parallel to the lower surface of the semiconductor die, the horizontal axis extends through a portion of the non-conductive material and through a portion of the conductive material.

21. The apparatus of claim 15, further comprising:
a housing containing at least a portion of the semiconductor die, the housing including a molding.

* * * * *

UNITED STATES PATENT AND TRADEMARK OFFICE
CERTIFICATE OF CORRECTION

PATENT NO.       : 8,525,321 B2
APPLICATION NO.  : 13/177060
DATED            : September 3, 2013
INVENTOR(S)      : Jatinder Kumar et al.

It is certified that error appears in the above-identified patent and that said Letters Patent is hereby corrected as shown below:

In the Claims

In column 10, line 2, In claim 3, delete "is" and insert -- includes --, therefor.

In column 10, line 5, In claim 4, delete "though" and insert -- through --, therefor.

In column 10, line 54, In claim 12, delete "though" and insert -- through --, therefor.

In column 11, line 22, In claim 17, delete "though" and insert -- through --, therefor.

Signed and Sealed this
Twenty-fourth Day of December, 2013

Margaret A. Focarino
*Commissioner for Patents of the United States Patent and Trademark Office*